United States Patent
Weis (10) Patent No.: US 6,762,443 B2
(45) Date of Patent: Jul. 13, 2004

(54) VERTICAL TRANSISTOR AND TRANSISTOR FABRICATION METHOD

(75) Inventor: Rolf Weis, Dresden (DE)

(73) Assignee: Infineon Technologies AG, Munich (DE)

(*) Notice: Subject to any disclaimer, the term of this patent is extended or adjusted under 35 U.S.C. 154(b) by 31 days.

(21) Appl. No.: 10/298,834

(22) Filed: Nov. 18, 2002

(65) Prior Publication Data

US 2003/0080346 A1 May 1, 2003

Related U.S. Application Data

(63) Continuation of application No. PCT/DE01/01800, filed on May 11, 2001.

(30) Foreign Application Priority Data

May 16, 2000 (DE) .......................................... 100 24 876

(51) Int. Cl.$^7$ ........................................... H01L 27/148
(52) U.S. Cl. ........................ 257/242; 257/244; 257/347; 438/149
(58) Field of Search ................................ 257/240–347; 438/149–156

(56) References Cited

U.S. PATENT DOCUMENTS

| 4,630,088 A | 12/1986 | Ogura et al. |
| 5,177,576 A | 1/1993 | Kimura et al. |
| 5,689,127 A | 11/1997 | Chu et al. |
| 6,020,239 A | 2/2000 | Gambino et al. |
| 6,492,221 B1 | 12/2002 | Hofmann et al. |

FOREIGN PATENT DOCUMENTS

| DE | 198 45 004 A1 | 4/2000 |
| DE | 198 45 058 A1 | 4/2000 |

Primary Examiner—Fetsum Abraham
(74) Attorney, Agent, or Firm—Laurence A. Greenberg; Werner H. Stemer; Ralph E. Locher (57) ABSTRACT

In DRAM memory cells, individual memory cells are isolated from one another by an isolation trench (STI). In such a case, a vertical transistor is formed by the isolation trench as SOI transistor because its channel region is isolated from a substrate by the isolation trench. A vertical transistor that is used, for example, in a DRAM memory cell and a method for making the transistor includes connecting the channel region of the vertical transistor to the substrate by disposing a conductive layer in the isolation trench between a lower insulation filling and an upper insulation filling.

15 Claims, 5 Drawing Sheets

VERTICAL TRANSISTOR AND TRANSISTOR FABRICATION METHOD

CROSS-REFERENCE TO RELATED APPLICATION

This application is a continuation of copending International Application No. PCT/DE01/01800, filed May 11, 2001, which designated the United States and was not published in English.

BACKGROUND OF THE INVENTION

Field of the Invention

The present invention relates to a vertical transistor that has a lower doping region, an upper doping region, and a channel, and to a method for its fabrication.

Vertical transistors are field-effect transistors in which the source region and drain region are disposed one above the other, rather than next to one another in a single plane, as is the case in planar field-effect transistors.

By way of example, U.S. Pat. No. 5,177,576 to Kimura et al. describes vertical transistors that have a floating body effect. The floating body effect means that there is no contact with the channel region of the transistor, which is, therefore, electrically floating.

The floating body effect is also relevant to planar transistors. For example, it occurs in what are referred to as silicon on insulator (SOI) transistors, in which the channel region is enclosed between source region, drain region, lateral insulations, and SOI insulation so that it is not in contact with a substrate.

In non-SOI transistors, the contact with a substrate allows charges that are formed in the channel region to migrate into the substrate so that the channel is not subject to any electrical charging effects. By contrast, in SOI transistors the channel is insulated, which, for example in the event of capacitive crosstalk between adjacent structures, correspondingly leads to charging effects in the channel because the charges that are formed can no longer be removed. The charging effects in the channel lead to a control effect on the channel that is similar to the gate electrode. This control effect means that the transistor can no longer be switched on and off in a defined way. A transistor that can no longer be controlled loses its functionality and is, therefore, unusable.

SUMMARY OF THE INVENTION

It is accordingly an object of the invention to provide a vertical transistor and a corresponding fabrication method that overcome the hereinafore-mentioned disadvantages of the heretofore-known devices and methods of this general type and that avoids the floating body effect.

With the foregoing and other objects in view, in a substrate, there is provided, in accordance with the invention, a vertical transistor including a lower doping region disposed in the substrate, an upper doping region disposed in the substrate above the lower doping region, a channel region disposed between the lower doping region and the upper doping region, the substrate defining an isolation trench extending at least to the channel region, insulating material filling the isolation trench, a lower insulation filling in the isolation trench, an upper insulation filling in the isolation trench above the lower insulation filling, and a conductive layer disposed between the lower insulation filling and the upper insulation filling in the isolation trench.

A vertical transistor is usually isolated with the aid of an isolation trench. The isolation is carried out, for example, in a memory having a memory cell array in which adjacent memory cells, which include a trench capacitor and a vertical transistor as a select transistor, are isolated from one another. To save space, the individual memory cells of the memory cell array are disposed so close together that the channel region of the vertical transistor is completely insulated between the gate oxide, the isolation trench, and the doping regions. According to the invention, in such a memory cell configuration it is also possible for the isolation trench to be configured with a conductive layer that is disposed between an upper insulation filling and a lower insulation filling so that the channel region of the vertical transistor is connected to the substrate.

In accordance with another feature of the invention, the conductive layer makes electrical contact with the channel region. This ensures that an electrical contact prevents the channel region from becoming charged.

In accordance with a further feature of the invention, the upper insulation filling reaches the upper doping region. Such a configuration allows a space-saving layout that, additionally, has the advantage that the upper doping region is very well insulated from the substrate and an adjacent circuit. As a result, leakage currents are reduced.

Furthermore, in accordance with an added feature of the invention, it is advantageous for the lower insulation filling to reach the lower doping region. Such a configuration means that the depth of the isolation trench in the substrate is such that the lower doping region is also as far as possible insulated from the substrate, and, in this case too, leakage currents to adjacent parts of the circuit are avoided.

Furthermore, in accordance with an additional feature of the invention, it is advantageous for the conductive layer to be formed from silicon, doped silicon, polycrystalline silicon, amorphous silicon, tungsten nitride, titanium nitride, tantalum nitride, or a silicide. An important factor in the case of the silicon-containing materials is the good comparability with the channel region, which is usually formed from silicon. The doping of the silicon is selected such that a good electrical connection is ensured. Selecting one of the above mentioned nitrides has the advantage that they act as a barrier and, thus, prevent undesirable diffusion of materials. Furthermore, the above-mentioned nitrides have the advantage of having a good conductivity. Silicides can also be used, on account of their good conductivity.

In accordance with yet another feature of the invention, the lower insulation filling and the upper insulation filling are formed at least in part from silicon oxide, silicon nitride, and/or silicon oxynitride. The use of these materials ensures that the upper and lower doping regions have good insulation properties with respect to adjacent conductive structures.

With the objects of the invention in view, in a substrate, there is also provided a vertical transistor including a lower doping region disposed in the substrate, an upper doping region disposed in the substrate above the lower doping region, a channel region disposed between the lower doping region and the upper doping region, the substrate defining an isolation trench extending at least to the channel region, insulating material filling the isolation trench, the insulating material having a lower insulation filling and an upper insulation filling disposed above the lower insulation filling, and a conductive layer disposed between the lower insulation filling and the upper insulation filling in the isolation trench.

With the objects of the invention in view, there is also provided a vertical transistor including a substrate defining an isolation trench, a lower doping region in the substrate, an upper doping region in the substrate above the lower doping region, a channel region disposed between the lower doping region and the upper doping region, the isolation trench extending at least to the channel region, insulating material filling the isolation trench, the insulating material having a lower insulation filling and an upper insulation filling disposed above the lower insulation filling, and a conductive layer disposed between the lower insulation filling and the upper insulation filling in the isolation trench.

With the objects of the invention in view, there is also provided a method for fabricating a vertical transistor, including the steps of forming a lower doping region in a substrate, forming an upper doping region in the substrate above the lower doping region with a channel region being formed between the lower doping region and the upper doping region, forming an isolation trench at least next to the channel region, forming a lower insulation filling in the isolation trench, forming a conductive layer in the isolation trench on the lower insulation filling, and forming an upper insulation filling in the isolation trench on the conductive layer.

The layered fabrication of the filling of the isolation trench is advantageous because, in such a procedure, the conductive layer is formed at a suitable position in the isolation trench and adjoins the channel region. A further advantage is that there is no need for any lithography steps for fabrication of the filling of the isolation trench because the layer depositions used to form the insulation fillings and the conductive layer can be carried out as processes that cover the entire surface.

In accordance with yet a further mode of the invention, the conductive layer is formed such that it is electrically connected to the channel region. This has the advantage that charging effects of the channel region are avoided as a result of charges being removed through the conductive layer.

In accordance with yet an added mode of the invention, the lower insulation filling is formed such that the isolation trench is initially filled with an insulating material, which is, then, planarized at the substrate surface and is recessed into the isolation trench by an etchback step. This method step has the advantage that it can be carried out using conventional methods for the fabrication of isolation trench fillings. In addition, however, a recessing process is carried out, advantageously, down to a depth that uncovers the channel region.

In accordance with a concomitant mode of the invention, the conductive layer is applied to the lower insulation filling by a sputtering process. This process allows selective formation of the conductive layer on the lower insulation filling. In addition, the degree of base coverage is increased by what are referred to as back-sputtering processes so that the material that has been sputtered on can be removed from the side walls of the isolation trench using an etching process and a conductive layer is retained on the base of the isolation trench.

Other features that are considered as characteristic for the invention are set forth in the appended claims.

Although the invention is illustrated and described herein as embodied in a vertical transistor and a corresponding fabrication method, it is, nevertheless, not intended to be limited to the details shown because various modifications and structural changes may be made therein without departing from the spirit of the invention and within the scope and range of equivalents of the claims.

The construction and method of operation of the invention, however, together with additional objects and advantages thereof, will be best understood from the following description of specific embodiments when read in connection with the accompanying drawings.

DESCRIPTION OF THE PREFERRED EMBODIMENTS

In the figures of the drawings, unless stated otherwise, identical reference symbols denote identical parts.

Figure 1:
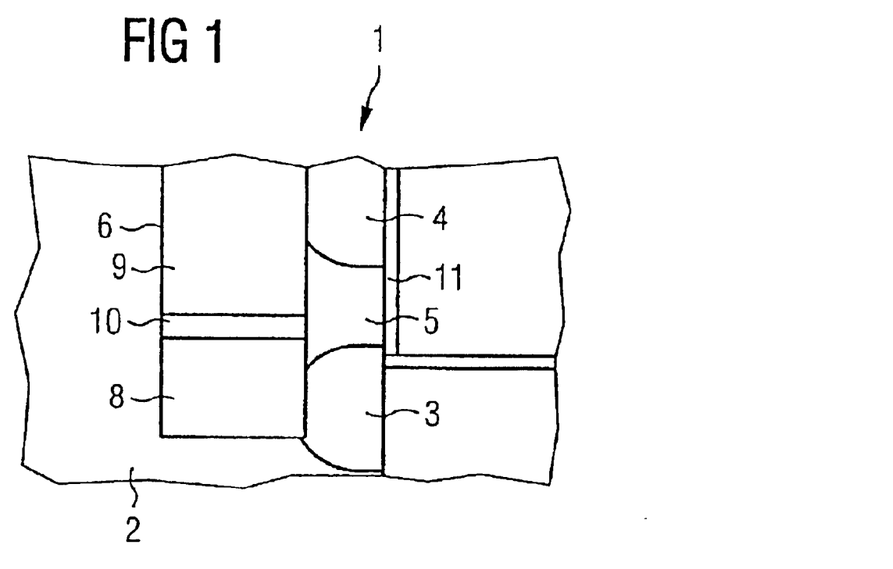
FIG. 1 is a fragmentary, cross-sectional view of a configuration according to the invention with a vertical transistor and an isolation trench.

Referring now to the figures of the drawings in detail and first, particularly to FIG. 1 thereof, there is shown a first configuration of the invention. A vertical transistor 1 has been formed in a substrate 2. The substrate 2 usually is of weakly doped silicon, such as, for example, weakly n-doped or weakly p-doped silicon. The vertical transistor 1 has a lower doping region 3 that is highly doped and an upper doping region 4 that is likewise highly doped. The upper doping region 4 is disposed above the lower doping region 3. The upper doping region 4 is, for example, the drain region of the vertical field-effect transistor, and the lower doping region is, for example, the source region of the field-effect transistor.

A channel region 5 has been formed between the lower doping region 3 and the upper doping region 4. The channel region 5 is adjoined by a gate oxide 11 that is usually formed from silicon oxide. Next to the vertical transistor 1, an isolation trench 6 has been formed in the substrate 2. In the present exemplary embodiment, the isolation trench 6 is disposed such that it adjoins the upper doping region 4, the channel 5, and the lower doping region 3. In its lower region, the isolation trench 6 is filled with a lower insulation filling 8 that is, for example, of a silicon oxide. Furthermore, there is a conductive layer 10 in the isolation trench 6, above the lower insulation filling 8. In the present exemplary embodiment, the conductive layer 10 is formed from a doped, polycrystalline silicon layer. Materials such as undoped silicon, amorphous silicon, doped silicon, tungsten nitride, titanium nitride, tantalum nitride, or a silicide can also be used to form the conductive layer 10. The upper insulation filling 9 is disposed above the conductive layer 10, likewise in the isolation trench 6. The upper insulation filling 9 is, for example, of silicon oxide.

The conductive layer 10 has the function of connecting the channel region 5 to the substrate 2. Such a connection makes it possible to avoid charging effects in the channel region 5 because charges can be removed from the channel region through the conductive layer 10 into the substrate 2. In the exemplary embodiment illustrated in FIG. 1, the channel region 5 without the conductive layer 10 would be insulated all the way around by the isolation trench 6, the gate oxide 11, the lower doping region 3, and the upper doping region 4. It is particularly advantageous for the vertical transistor to be formed as an annular transistor around a trench.

A method for fabricating the configuration illustrated in FIG. 1 first of all forms the vertical transistor 1, in which the lower doping region 3 and the upper doping region 4 are formed by the introduction of dopant that diffuses into the substrate 2. Then, the isolation trench 6 is etched into the substrate 2 next to the upper doping region 4, next to the channel region 5, and next to the lower doping region 3. The side walls of the isolation trench 6 are usually thermally oxidized in a process chamber with the aid of a heat-treatment step and an oxidizing atmosphere. Then, the isolation trench 6 is completely filled with an oxide, which also forms on the surface of the substrate 2. In a subsequent chemical mechanical polishing (CMP) step, the oxide layer that has been formed on the surface is removed so that the oxide in the isolation trench 6 remains. In a subsequent etching step, the oxide in the isolation trench 6 is recessed. By way of example, a wet-etching process using hydrofluoric acid is suitable for this step. By using a suitable etching time, the etching depth in the isolation trench 6 is set such that the upper edge of the lower insulation filling 8 lies at the height of the channel region 5. The etching process uncovers the upper side walls of the isolation trench 6 so that, at these locations, the silicon substrate forms the surface of the isolation trench.

The subsequent formation of the conductive layer 10 can take place in various ways. In the present exemplary embodiment, a polysilicon layer is deposited on the entire surface of the substrate so that the isolation trench 6 is filled with polysilicon that is also formed on the substrate surface. In a subsequent CMP process, the polysilicon is removed from the surface of the substrate 2, and the polysilicon that remains in the isolation trench 6 is recessed, in a subsequent etchback process, into the isolation trench 6 until a conductive layer 10 is formed above the lower insulation filling 8. Before the conductive layer 10 is formed, it is optionally possible for a liner to be formed below the conductive layer. In such a case, the liner has the role of acting as a diffusion barrier between the conductive layer 10 and the channel region 5. The etchback process can be carried out, for example, by an anisotropic etch that uses the same etching mask as has been used to form the isolation trench 6. This ensures that the polysilicon-recessing process in the isolation trench takes place in a self-aligned manner with respect to the isolation trench.

A further possible way of forming the conductive layer 10 lies in using a sputtering process. A particularly suitable sputtering process is ionized sputtering, in which the material that is to be sputtered is ionized by a high-frequency magnetic field and, having been so directed and accelerated through an electrical field, is, preferentially, deposited on the base of the isolation trench 6. Furthermore, during what is referred to as back-sputtering, the base coverage of the isolation trench is improved. For such a purpose, not only is a high-frequency AC voltage connected to the sputtering cathode, but also a high-frequency voltage is connected to the anode, on which the substrate is disposed. The back-sputtering, which is also referred to as bias sputtering, leads to sputtering material, preferentially, being disposed on the base of a trench.

Then, the isolation trench 6 is filled with the upper insulation filling 9. Once again, standard processes for forming an insulation material in a trench are suitable for this step. By way of example, thermal oxidation of the side walls of the isolation trench 6 and of the conductive layer 10 is carried out. Then, an oxide layer is disposed in the isolation trench 6 above the conductive layer 10, this oxide layer filling the isolation trench 6 and also being formed on the surface of the substrate 2. The insulating material situated on the surface of the substrate 2 is removed using a subsequent CMP process so that, in the end, the upper insulation filling 9 is disposed in the isolation trench 6.

Figure 2:
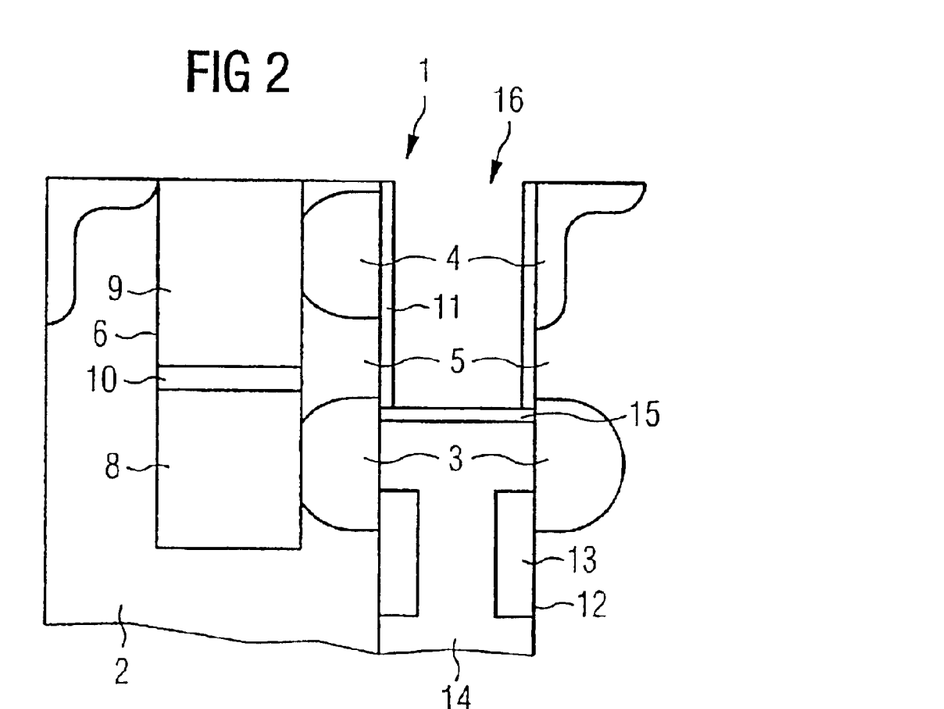
FIG. 2 is a fragmentary, cross-sectional view of a further configuration according to the invention with a vertical transistor, a trench capacitor, and an isolation trench.

FIG. 2 illustrates a second exemplary embodiment of a vertical transistor according to the invention. A vertical transistor 1 has been formed in a substrate 2. In the present exemplary embodiment, the vertical transistor is formed as an annular transistor around a trench 12. The vertical transistor 1 includes a lower doping region 3 and an upper doping region 4, which is disposed above the lower doping region 3. A channel region 5 is disposed between the lower doping region 3 and the upper doping region 4. The substrate 2 is usually made from silicon. By way of example, the substrate 2 may be lightly doped with p-dopant or n-dopant. The lower doping region 3 and the upper doping region 4 are formed in the substrate 2 by the introduction of dopant. An isolation trench 6 is disposed next to the vertical transistor 1. In its lower region, the isolation trench 6 is filled with a lower insulation filling 8. A conductive layer 10 is disposed above the lower insulation filling 8. The conductive layer 10 connects the substrate 2 and the channel region 5 to one another. An upper insulation filling 9 is disposed above the conductive layer 10 in the isolation trench 6. In the present exemplary embodiment, the upper insulation filling 9 adjoins the upper doping region 4. The lower insulation filling 8 adjoins the lower doping region. The vertical transistor 1 illustrated in FIG. 2 is used as a select transistor in a DRAM memory cell. The trench capacitor 16 is disposed in the trench 12. An insulation collar 13 is disposed on the inner wall of the upper region of the trench 12. Furthermore, the trench 12 is filled with a conductive trench filling 14 that reaches the lower doping region 3. There is an insulating covering layer 15 on the conductive trench filling 14.

A method for fabricating the exemplary embodiment illustrated in FIG. 2 initially provides for a trench capacitor to be formed. For such a purpose, a trench 12 is etched into a substrate 2. In the lower region of the trench 12, a trench capacitor is formed in a customary way. An insulation collar 13 is formed in the upper region of the trench capacitor 16, and the trench is filled with a conductive trench filling 14 in the region of the trench capacitor.

The lower doping region 3 is usually formed by a heat-treatment step, in which dopant diffuses out of the conductive trench filling 14 into the substrate 2. The upper doping region 4 is produced, for example, by implantation of dopant into the substrate 2.

A method for fabricating a vertical transistor according to the invention is described with reference to FIGS. 3 through 9, which represent the progress of the processing.

Figure 3:
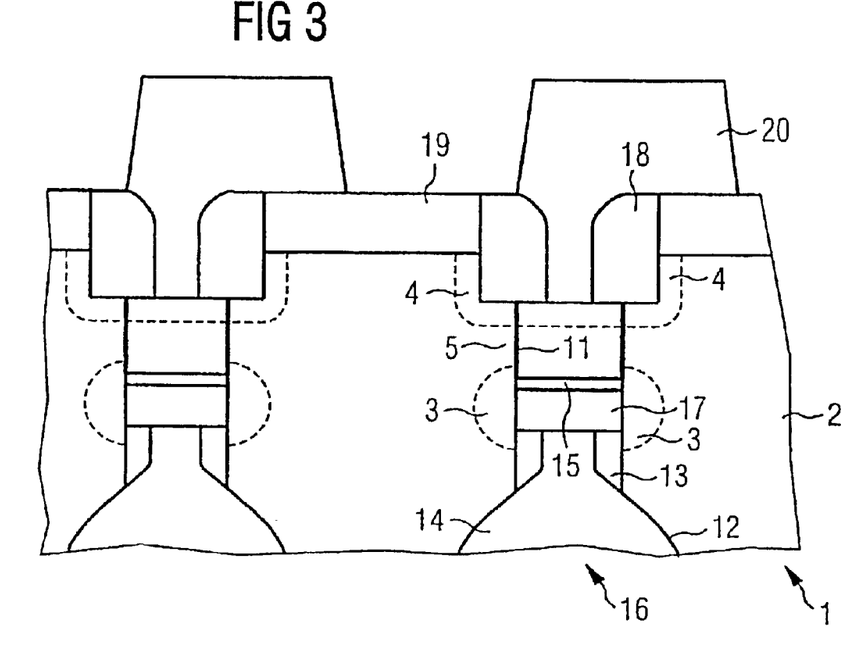
FIG. 3 is a fragmentary, cross-sectional view of a configuration with memory cells for the fabrication of an isolation trench according to the invention.

FIG. 3 shows a vertical transistor 1 in a substrate 2. The vertical transistor 1 has a lower doping region 3 and an upper doping region 4, both of which are disposed in the form of a ring around a trench 12. A channel region 5 is disposed between the lower doping region 3 and the upper doping region 4. A gate oxide 11 is also disposed in the trench 12, next to the channel region 5. The trench 12 is filled with a conductive trench filling 14. In the upper region of the trench 12, which, in this case, is configured in the shape of a bottle, there is an insulation collar 13. A conductive cover 17 is disposed above the insulation collar 13. The conductive cover 17 is connected to the lower doping region 3. There is an insulating covering layer 15 on the conductive cover 17.

In the present exemplary embodiment, the substrate 2 is formed, for example, from weakly doped silicon. The lower doping region 3 and the upper doping region 4 are formed as strongly doped regions in the substrate 2. A dielectric ring 18 is disposed above the upper doping region 4. A dielectric layer 19 is disposed above the substrate, next to the trench 12. In the present exemplary embodiment, the dielectric layer 19 and the dielectric ring 18 are of silicon nitride. A mask 20 that has already been patterned is formed above this configuration.

A method for fabricating the configuration illustrated in FIG. 3 provides a substrate 2, in which, first of all, a trench 12 is etched using a suitable mask. In the present example, the trench 12 is widened in its lower region to form the bottle shape. The trench capacitor is formed in the lower region of the trench 12 using conventional methods described in the prior art. An insulation collar 13 is also formed in the neck region of the bottle-shaped trench 12. Then, the trench 12 is filled with a conductive trench filling 14. In a subsequent recessing process, both the insulation collar 13 and the conductive trench filling 14 are recessed into the trench. The conductive cover 17 is formed above the recessed conductive trench filling and the recessed insulation collar 13. This is possible, for example, by deposition of a highly doped polysilicon layer. The highly doped polysilicon layer is, then, likewise recessed into the trench 12 so that the conductive cover 17 is formed. In the present exemplary embodiment, the conductive cover 17 is formed from highly doped silicon so that in a heat-treatment step the lower doping region 3 is formed in the substrate 2 by outdiffusion of dopant. An insulating covering layer 15 is formed on the conductive cover 17. Then, the upper doping region 4 is formed in the trench 12 by implantation.

Nitride layer deposition and subsequent etching back (spacer formation) form the dielectric ring 18 of silicon nitride. The dielectric layer 19 of silicon nitride is also formed. Then, a photosensitive layer is applied to the configuration, exposed and developed so that the mask 20 illustrated in FIG. 3 is formed.

Figure 4:
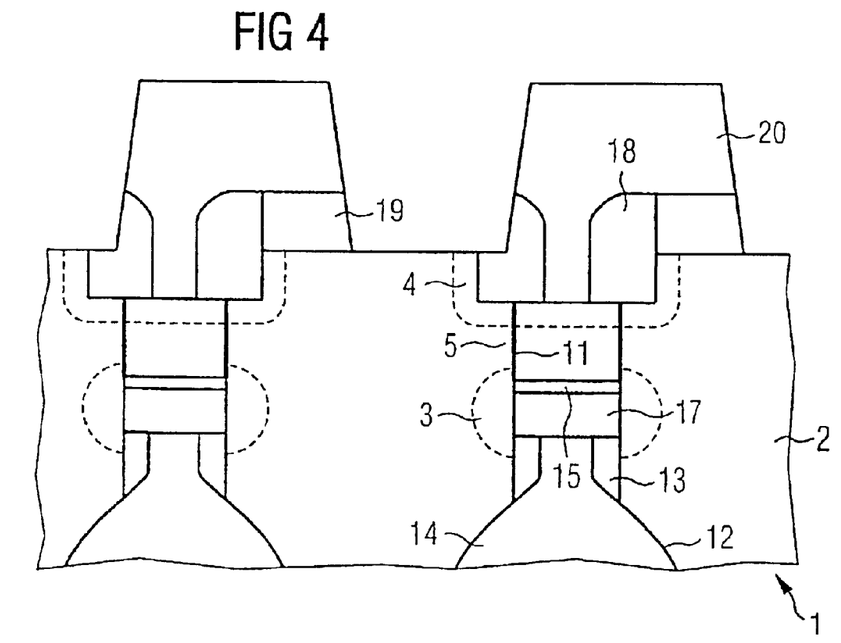
FIGS. 4 to 9 are fragmentary, cross-sectional views of respective steps of a processing sequence of the memory cell configuration of FIG. 3.

Referring now to FIG. 4, the mask 20 is used for a first etching process, which primarily etches the uncovered dielectric layer 19 and the uncovered dielectric ring 18. The etching is an anisotropic etch to form a trench with approximately vertical flanks. Such etching can be carried out selectively because the dielectric ring 18 and the dielectric layer 19 are formed from silicon nitride.

Figure 5:
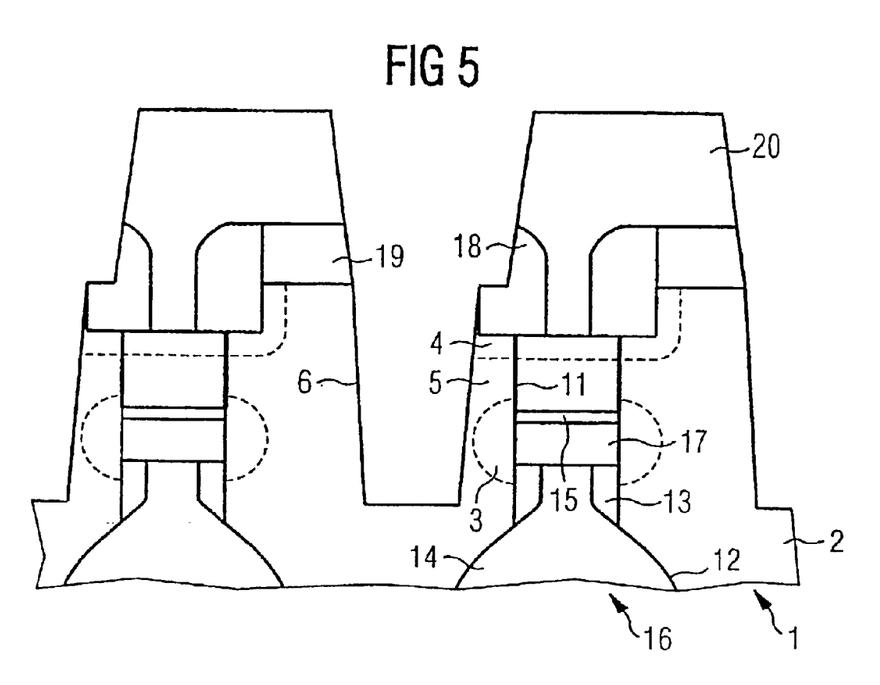

Referring now to FIG. 5, the isolation trench 6 is etched into the substrate 2 using the dielectric ring 18 and the dielectric layer 19 as etching mask. A correspondingly selective etch leads to a very small amount of material being removed by etching from the dielectric layer 19, which is of silicon nitride, and from the dielectric ring 18, and to a large amount of material being removed by etching from the substrate 2.

Figure 6:
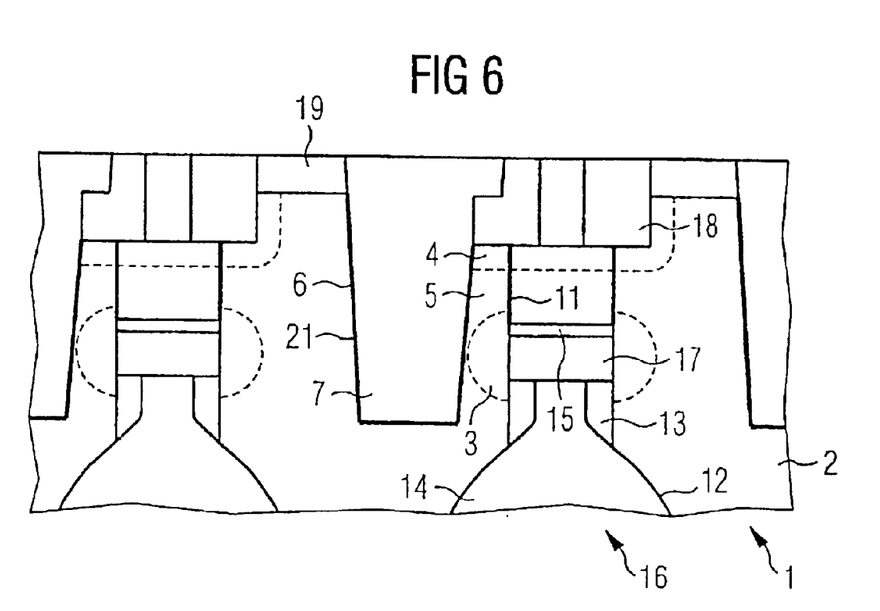

Referring now to FIG. 6, first of all, the mask 20 is removed from the surface and thermal oxidation of the uncovered substrate 2 is carried out. In the process, a silicon oxide layer is formed. Then, a silicon oxide layer is deposited by a chemical vapor deposition (CVD) step or by a high density plasma (HDP) process step, which is, likewise, a CVD process.

The silicon oxide layer is formed in the isolation trench 6 and on the surface of the substrate.

Then, the silicon oxide layer is removed from the surface by a CMP process and the surface is planarized.

Figure 7:
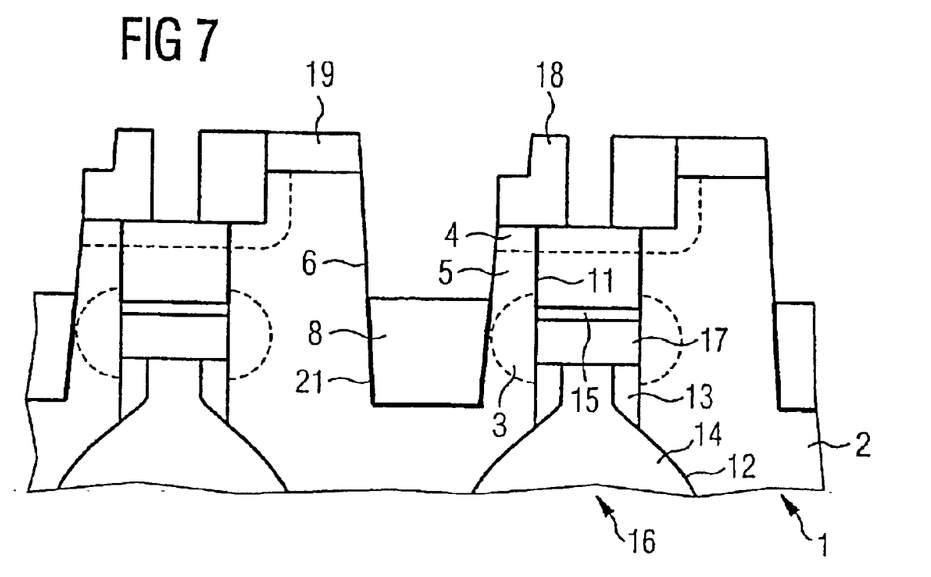

Referring now to FIG. 7, the insulating material 7 is recessed into the trench 6. In the process, the lower insulation filling 8 is formed. A wet-chemical etching process using hydrofluoric acid can be used for the recessing.

Figure 8:
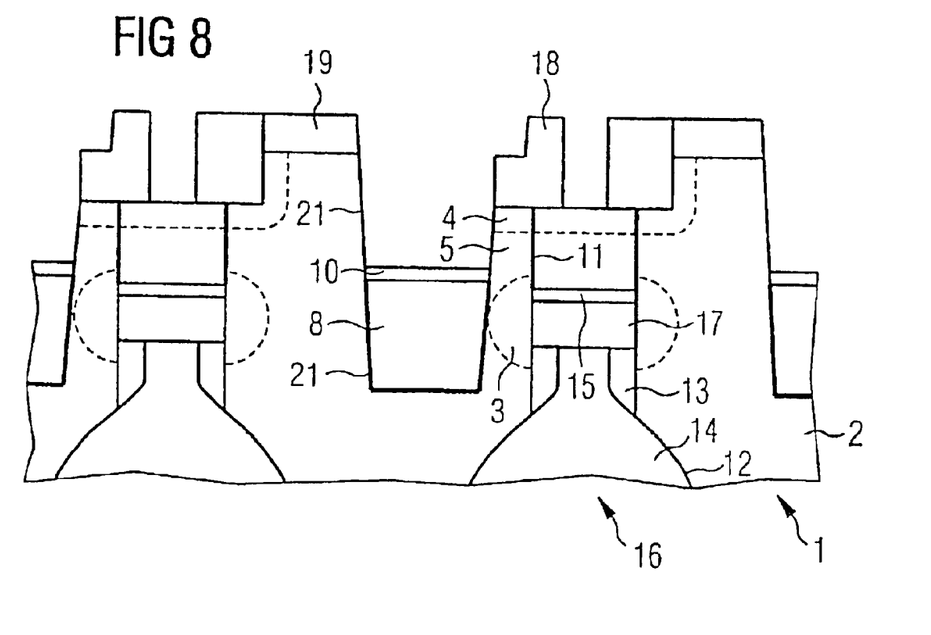

Referring now to FIG. 8, a polysilicon layer is deposited on the substrate. In the process, the isolation trench 6 is filled with the polysilicon layer, which is also deposited on the surface of the substrate. The polysilicon layer is removed from the surface of the substrate using a subsequent CMP process, is planarized, and is, then, recessed into the trench 6 so that the conductive layer 10 is formed. Then, a thermal oxidation is carried out, which oxidizes the uncovered side walls of the isolation trench 6 and the surface of the conductive layer 10 and forms a layer of oxide 21.

Figure 9:
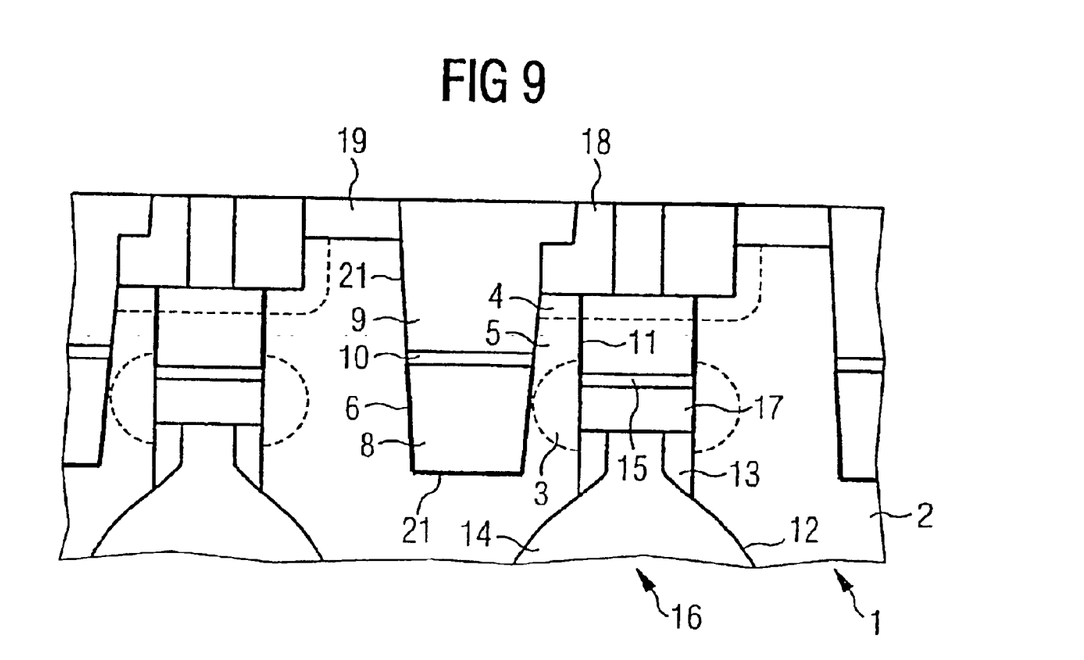

Referring now to FIG. 9, an oxide layer is deposited, this layer filling the trench 6 and being deposited on the surface of the substrate. In a subsequent CMP process, the oxide layer is removed from the substrate surface and, in the process, the upper insulation filling 9 is formed.

I claim:

1. In a substrate, a vertical transistor comprising:
   a lower doping region disposed in the substrate;
   an upper doping region disposed in the substrate above said lower doping region;
   a channel region disposed between said lower doping region and said upper doping region;
   the substrate defining an isolation trench extending at least to said channel region;
   insulating material filling said isolation trench;
   a lower insulation filling in said isolation trench;
   an upper insulation filling in said isolation trench above said lower insulation filling; and
   a conductive layer disposed between said lower insulation filling and said upper insulation filling in said isolation trench.

2. The transistor according to claim 1, wherein said conductive layer electrically contacts said channel region.

3. The transistor according to claim 1, wherein said upper insulation filling extends at least to said upper doping region.

4. The transistor according to claim 1, wherein said lower insulation filling extends at least to said lower doping region.

5. The transistor according to claim 3, wherein said lower insulation filling extends at least to said lower doping region.

6. The transistor according to claim 1, wherein said conductive layer is of a material selected from one of a group consisting of silicon, doped silicon, polycrystalline silicon, amorphous silicon, tungsten nitride, titanium nitride, tantalum nitride, and a silicide.

7. The transistor according to claim 1, wherein said lower insulation filling and said upper insulation filling are at least in part of a material selected from at least one of the group consisting of silicon oxide, silicon nitride, and silicon oxynitride.

8. In a substrate, a vertical transistor comprising:
   a lower doping region disposed in the substrate;
   an upper doping region disposed in the substrate above said lower doping region;
   a channel region disposed between said lower doping region and said upper doping region;
   the substrate defining an isolation trench extending at least to said channel region;
   insulating material filling said isolation trench, said insulating material having:
     a lower insulation filling; and
     an upper insulation filling disposed above said lower insulation filling; and a conductive layer disposed between said lower insulation filling and said upper insulation filling in said isolation trench.

9. A vertical transistor comprising:

a substrate defining an isolation trench;

a lower doping region in said substrate;

an upper doping region in said substrate above said lower doping region;

a channel region disposed between said lower doping region and said upper doping region;

said isolation trench extending at least to said channel region;

insulating material filling said isolation trench, said insulating material having:
  a lower insulation filling; and
  an upper insulation filling disposed above said lower insulation filling; and a conductive layer disposed between said lower insulation filling and said upper insulation filling in said isolation trench.

10. A method for fabricating a vertical transistor, which comprises:

forming a lower doping region in a substrate;

forming an upper doping region in the substrate above the lower doping region with a channel region being formed between the lower doping region and the upper doping region;

forming an isolation trench at least next to the channel region;

forming a lower insulation filling in the isolation trench;

forming a conductive layer in the isolation trench on the lower insulation filling; and forming an upper insulation filling in the isolation trench on the conductive layer.

11. The method according to claim 10, wherein the conductive layer is electrically connected to the channel region.

12. The method according to claim 10, which further comprises carrying out the lower insulation filling forming step by:

initially filling the isolation trench with an insulating material; and subsequently planarizing the insulating material at a surface of the substrate and recessing the insulating material into the isolation trench by an etchback technique.

13. The method according to claim 10, which further comprises forming the lower insulation filling by initially filling the isolation trench with an insulating material that is subsequently planarized at a surface of the substrate and recessed into the isolation trench by an etchback technique.

14. The method according to claim 10, which comprises applying the conductive layer to the lower insulation filling by a sputtering technique.

15. The method according to claim 10, which comprises applying the conductive layer to the lower insulation filling by sputtering.

* * * * *